US012609155B2

(12) United States Patent
Ahammed et al.

(10) Patent No.: US 12,609,155 B2
(45) Date of Patent: Apr. 21, 2026

(54) DYNAMIC TRANSMITTER CALIBRATION

(71) Applicant: QUALCOMM Incorporated, San Diego, CA (US)

(72) Inventors: Jaseem Ahammed, San Marcos, CA (US); Patrick Isakanian, El Dorado Hills, CA (US); Ashwin Sethuram, San Clemente, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 19 days.

(21) Appl. No.: 18/390,600

(22) Filed: Dec. 20, 2023

(65) Prior Publication Data

US 2025/0210099 A1 Jun. 26, 2025

(51) Int. Cl.
| | |
|---|---|
| *G11C 11/4096* | (2006.01) |
| *G11C 7/10* | (2006.01) |
| *G11C 11/4093* | (2006.01) |
| *G11C 29/02* | (2006.01) |
| *G11C 29/12* | (2006.01) |
| *H03K 5/14* | (2014.01) |
| *H03K 5/00* | (2006.01) |

(52) U.S. Cl.
CPC ............ *G11C 11/4096* (2013.01); *H03K 5/14* (2013.01); *H03K 2005/0015* (2013.01)

(58) Field of Classification Search
None
See application file for complete search history.

(56) References Cited

U.S. PATENT DOCUMENTS

| | | | | |
|---|---|---|---|---|
| 4,820,942 A | * | 4/1989 | Chan ................ | H03K 19/00361 |
| | | | | 327/310 |
| 2005/0116752 A1 | * | 6/2005 | Chan ................ | H03K 19/00384 |
| | | | | 327/170 |
| 2009/0168549 A1 | | 7/2009 | Jeon | |
| 2019/0190505 A1 | * | 6/2019 | Yi ............................ | H03K 5/14 |
| 2023/0142493 A1 | | 5/2023 | Kim et al. | |

OTHER PUBLICATIONS

International Search Report and Written Opinion—PCT/US2024/058380—ISA/EPO—Mar. 24, 2025.

* cited by examiner

*Primary Examiner* — Anh Q Tran
(74) *Attorney, Agent, or Firm* — Loza & Loza, LLP

(57) ABSTRACT

A driver circuit includes a flipflop and a first plurality of series-coupled delay elements. The flipflop may be configured to encode a sequence of codewords in a multibit signal. The first plurality of series-coupled delay elements may be configured to propagate the multibit signal to a tuning circuit in the driver circuit during voltage ramping of a power supply used by the driver circuit. Each codeword in the sequence of codewords may be used to configure the tuning circuit during the voltage ramping of the power supply. The sequence of codewords may be configured to incrementally change impedance of the driver during the voltage ramping of the power supply.

19 Claims, 9 Drawing Sheets

Data Signal Received with Jitter and Distortion

800

| Simultaneous | Initial | Code Change | | New |
|---|---|---|---|---|
| | $T_{init}$ | $T_0$ | $T_0'$ | $T_{Final}$ |
| Seg-0 | 240 | 160 | 320 | 200 |
| Seg-1 | 240 | 160 | 320 | 200 |
| Seg-2 | 240 | 160 | 320 | 200 |
| Seg-3 | 240 | 160 | 320 | 200 |
| Seg-4 | 240 | 160 | 320 | 200 |
| Seg-5 | 240 | 160 | 320 | 200 |
| Seg-6 | 240 | 160 | 320 | 200 |
| *Effective $R_{TX}$* | *40.0* | *26.7* | *53.5* | *33.3* |

820

| Code Dispersion | Initial | Code Change Dispersion Over 1 UI | | | | | | | New |
|---|---|---|---|---|---|---|---|---|---|
| | $T_{init}$ | $T_0$ | $T_1$ | $T_2$ | $T_3$ | $T_4$ | $T_5$ | $T_6$ | $T_{Final}$ |
| Seg-0 | 240 | 160 | 200 | 200 | 200 | 200 | 200 | 200 | 200 |
| Seg-1 | 240 | 240 | 160 | 200 | 200 | 200 | 200 | 200 | 200 |
| Seg-2 | 240 | 240 | 240 | 160 | 200 | 200 | 200 | 200 | 200 |
| Seg-3 | 240 | 240 | 240 | 240 | 160 | 200 | 200 | 200 | 200 |
| Seg-4 | 240 | 240 | 240 | 240 | 240 | 160 | 200 | 200 | 200 |
| Seg-5 | 240 | 240 | 240 | 240 | 240 | 240 | 160 | 200 | 200 |
| Seg-6 | 240 | 240 | 240 | 240 | 240 | 240 | 240 | 160 | 200 |
| *Effective $R_{TX}$* | *40.0* | *36.9* | *35.8* | *34.8* | *33.8* | *32.9* | *32.0* | *33.3* | *33.3* |

640

900

DYNAMIC TRANSMITTER CALIBRATION

TECHNICAL FIELD

The present disclosure generally relates to driver circuits in a memory interface and more particularly to a driver circuit that includes a driver operable at multiple voltage levels.

BACKGROUND

Electronic device technologies have seen explosive growth over the past several years. For example, growth of cellular and wireless communication technologies has been fueled by better communications, hardware, larger networks, and more reliable protocols. Wireless service providers are now able to offer their customers an ever-expanding array of features and services, and provide users with unprecedented levels of access to information, resources, and communications. To keep pace with these service enhancements, mobile electronic devices (e.g., cellular phones, tablets, laptops, etc.) have become more powerful and complex than ever. Wireless devices may include a high-speed bus interface for communication of signals between hardware components. For example, the high-speed bus interface may be implemented using a Peripheral Component Interconnect Express (PCIe) bus, Universal Serial Bus (USB) or Serial Advanced Technology Attachment (SATA), among others.

In certain implementations, a high-speed serial bus interface may be configurable for different modes of communication. For example, integrated circuit (IC) devices that include memory interfaces have physical layer circuits may be expected to operate in one or more high-speed data communication modes and one or more low-speed data communication modes. Different signaling voltages may be defined for high-speed and low-speed data communication modes. Increased demands for higher data rates require increasingly tight timing between circuits within the memory interface in order to ensure integrity of the data and clock signals between memory controller and memory devices.

Performance, accuracy and/or reliability of data communication interfaces may depend on the flexibility and reliability of driver circuits that are expected to accommodate changes in transmission speed, supply voltage changes or variances and other factors that can impact the operation of high-speed data links. Therefore, there is an ongoing need for improvements that provide reliable transmission of clock, data and control signals over high-speed data links.

SUMMARY

Certain aspects of the disclosure relate to systems, apparatus, methods and circuits that can be used in high-speed interfaces to provide pre-equalization or enhanced line driving capability in certain modes of operation.

In various aspects of the disclosure, a driver circuit includes a flipflop configured to encode a sequence of codewords in a multibit signal, and a first plurality of series-coupled delay elements that is configured to propagate the multibit signal to a calibration circuit in the driver circuit during voltage ramping of a power supply used by the driver circuit. Each codeword in the sequence of codewords is used to configure the calibration circuit during the voltage ramping of the power supply.

In various aspects of the disclosure, an apparatus includes means for encoding a sequence of codewords in a multibit signal, and means for propagating the multibit signal to a calibration circuit in a driver circuit during voltage ramping of a power supply used by the driver circuit. Each codeword in the sequence of codewords is used to configure the calibration circuit during the voltage ramping of the power supply.

In various aspects of the disclosure, a method for reconfiguring a driver circuit includes encoding a sequence of codewords in a multibit signal, propagating the multibit signal to a calibration circuit in the driver circuit during voltage ramping of a power supply used by the driver circuit, and using each codeword in the sequence of codewords to configure the calibration circuit during the voltage ramping of the power supply.

In one aspect, the sequence of codewords is configured to incrementally change impedance of the driver during the voltage ramping of the power supply.

In certain aspects, the first plurality of series-coupled delay elements comprises a first configurable delay element configured to propagate rising edges more quickly than it propagates falling edges. The first plurality of series-coupled delay elements may include a second configurable delay element configured to propagate falling edges more quickly than it propagates rising edges. The first configurable delay element and the second configurable delay element may be configured to cause rising edges in the multibit signal to be propagated more quickly through the first plurality of series-coupled delay elements than falling edges in the multibit signal.

In one aspect, each delay element in the first plurality of series-coupled delay elements includes an inverter. In another aspect, each delay element in the first plurality of series-coupled delay elements includes a non-inverting buffer circuit.

In certain aspects, the driver circuit includes a second plurality of series-coupled delay elements that receives an output of the first plurality of series-coupled delay elements. Each delay element in the second plurality of series-coupled delay elements is configured to propagate the output of the first plurality of series-coupled delay elements to a corresponding segment of the driver circuit. Each delay element in the second plurality of series-coupled delay elements may include a non-inverting buffer circuit.

In one aspect, the driver circuit is provided in a low-power double data rate synchronous dynamic random access memory interface.

DETAILED DESCRIPTION

Figure 1:
FIG. 1 illustrates an example of a system-on-a-chip (SOC) that may be adapted in accordance with certain aspects of the present disclosure.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well-known structures and components are shown in block diagram form in order to avoid obscuring such concepts.

With reference now to the Figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

The terms "computing device" and "mobile device" are used interchangeably herein to refer to any one or all of servers, personal computers, smartphones, cellular telephones, tablet computers, laptop computers, notebooks, ultrabooks, palm-top computers, personal data assistants (PDAs), wireless electronic mail receivers, multimedia Internet-enabled cellular telephones, Global Positioning System (GPS) receivers, wireless gaming controllers, and similar personal electronic devices which include a programmable processor. While the various aspects are particularly useful in mobile devices (e.g., smartphones, laptop computers, etc.), which have limited resources (e.g., processing power, battery, size, etc.), the aspects are generally useful in any computing device that may benefit from improved processor performance and reduced energy consumption.

The term "multicore processor" is used herein to refer to a single integrated circuit (IC) chip or chip package that contains two or more independent processing units or cores (e.g., CPU cores, etc.) configured to read and execute program instructions. The term "multiprocessor" is used herein to refer to a system or device that includes two or more processing units configured to read and execute program instructions.

The term "system on chip" (SoC) is used herein to refer to a single integrated circuit (IC) chip that contains multiple resources and/or processors integrated on a single substrate. A single SoC may contain circuitry for digital, analog, mixed-signal, and radio-frequency functions. A single SoC may also include any number of general purpose and/or specialized processors (digital signal processors (DSPs), modem processors, video processors, etc.), memory blocks (e.g., read only memory (ROM), random access memory (RAM), flash, etc.), and resources (e.g., timers, voltage regulators, oscillators, etc.), any or all of which may be included in one or more cores.

Process technology employed to manufacture semiconductor devices, including IC devices is continually improving. Process technology includes the manufacturing methods used to make IC devices and defines transistor size, operating voltages and switching speeds. Features that are constituent elements of circuits in an IC device may be referred as technology nodes and/or process nodes. The terms technology node, process node, process technology may be used to characterize a specific semiconductor manufacturing process and corresponding design rules. Faster and more power-efficient technology nodes are being continuously developed through the use of smaller feature size to produce smaller transistors that enable the manufacture of higher-density ICs.

ICs typically provide multiple voltage domains for power saving purposes. For example, higher voltage domains provide power at higher voltage levels than lower voltage domains. Higher voltage domains are sometimes needed for interfacing with external devices, while core logic circuits can generally operate at the lower voltage levels available in lower voltage domains. For the purposes of this disclosure, a thick-oxide transistor may refer to a transistor that has a gate oxide thickness sufficient to enable the transistor to withstand and operate at the higher voltage levels in higher voltage domains and a thin-oxide transistor may refer to a transistor that has a gate oxide thickness that is insufficient to avoid electrical overstress when the transistor spans a higher voltage level in the higher voltage domains. In certain examples disclosed herein, a thin-oxide transistor may be rated for voltages up to 0.6 Volts and a thick-oxide transistor may be rated for voltages greater than 0.6 Volts and thick-oxide transistors may be used in a higher a high-voltage domain that provides power at 1.2 Volts.

Advancements in process technologies tend to reduce transistor gate length and other feature sizes with IC devices. Reductions in gate length and feature sizes can increase the susceptibility of IC devices to electrostatic discharge (ESD) events. IC devices often include ESD protection circuits that can protect interface circuits during different types of ESD events. IC devices may be tested to ensure that they meet minimum industry standards regarding ESD protection. IC device qualification processes may include testing the susceptibility of the IC device to ESD events based on a human-body model (HBM) or based on a charged-device model (CDM) characterization of ESD events. Some ESD protection circuits are based on or evaluated using an HBM or a CDM. The HBM is intended to characterize the susceptibility of devices to damage from ESD events of ±1 k Volt resulting from human touching of an electronic device. The CDM is intended to characterize the susceptibility of devices to damage from ESD events of ±250 Volts that relate to sudden discharges of energy accumulated in an IC chip or package through direct contact charging or field-induced charging.

FIG. 1 illustrates examples of components and interconnections in a system-on-chip (SoC) 100, including a memory interface/bus 126, that may be suitable for implementing certain aspects of the present disclosure. The SoC 100 may include a number of heterogeneous processors, such as a central processing unit (CPU) 102, a modem processor 104, a graphics processor 106, and an application processor 108. Each processor 102, 104, 106, 108, may include one or more cores, and each processor/core may perform operations independent of the other processors/cores. The processors 102, 104, 106, 108 may be organized in close proximity to one another (e.g., on a single substrate, die, integrated chip, etc.) so that the processors may operate at a much higher frequency/clock rate than would be possible if the signals were to travel off-chip. The proximity of the cores may also allow for the sharing of on-chip memory and resources (e.g., voltage rails), as well as for more coordinated cooperation between cores.

The SoC 100 may include system components and resources 110 for managing sensor data, analog-to-digital conversions, and/or wireless data transmissions, and for performing other specialized operations (e.g., decoding high-definition video, video processing, etc.). System components and resources 110 may also include components such as voltage regulators, oscillators, phase-locked loops (PLLs), peripheral bridges, data controllers, system controllers, access ports, timers, and/or other similar components used to support the processors and software clients running on the computing device. The system components and resources 110 may also include circuitry for interfacing with peripheral devices, such as cameras, electronic displays, wireless communication devices, external memory chips, etc.

The SoC 100 may further include a Universal Serial Bus (USB) or other serial bus controller 112, one or more memory controllers 114, and a centralized resource manager (CRM) 116. The SoC 100 may also include an input/output module (not illustrated) for communicating with resources external to the SoC, each of which may be shared by two or more of the internal SoC components.

The processors 102, 104, 106, 108 may be interconnected to the USB controller 112, the memory controller 114, system components and resources 110, CRM 116, and/or other system components via an interconnection/bus module 122, which may include an array of reconfigurable logic gates and/or implement a bus architecture. Communications may also be provided by advanced interconnects, such as high-performance networks on chip.

The interconnection/bus module 122 may include or provide a bus mastering system configured to grant SoC components (e.g., processors, peripherals, etc.) exclusive control of the bus (e.g., to transfer data in burst mode, block transfer mode, etc.) for a set duration, number of operations, number of bytes, etc. In some cases, the interconnection/bus module 122 may implement an arbitration scheme to prevent multiple master components from attempting to drive the bus simultaneously.

The memory controller 114 may be a specialized hardware module configured to manage the flow of data to and from a memory 124 via the memory interface/bus 126. In some examples, the memory controller 114 includes one or more processors configured to perform read and write operations with the memory 124. Examples of processors include microprocessors, microcontrollers, digital signal processors (DSPs), field programmable gate arrays (FPGAs), programmable logic devices (PLDs), state machines, gated logic, discrete hardware circuits, and other suitable hardware configured to perform the various functionality described throughout this disclosure. Certain aspects disclosed herein may relate to a memory 124 that is included in an SoC 100.

Memory technologies described herein may be suitable for storing instructions, programs, control signals, and/or data for use in or by a computer or other digital electronic device. Any references to terminology and/or technical details related to an individual type of memory, interface, standard, or memory technology are for illustrative purposes only, and not intended to limit the scope of the claims to a particular memory system or technology unless specifically recited in the claim language. Mobile computing device architectures have grown in complexity, and now commonly include multiple processor cores, SoCs, co-processors, functional modules including dedicated processors (e.g., communication modem chips, GPS receivers, etc.), complex memory systems, intricate electrical interconnections (e.g., buses and/or fabrics), and numerous other resources that execute complex and power intensive software applications (e.g., video streaming applications, etc.).

Certain aspects of the disclosure are applicable to input/out (I/O) circuits that provide an interface between core circuits and memory devices. The memory 124 may include or incorporate Synchronous Dynamic Random Access Memory (SDRAM), including Low-Power double data rate SDRAM, which may be referred to as low-power DDR SDRAM, LPDDR SDRAM or, in some instances, LPDDRi SDRAM where i describes the technology generation of the LPDDR SDRAM. In one example, the memory 124 may be operated in LPDDR5 SDRAM, LPDDR5X SDRAM and LPDDR6 SDRAM SDRAM modes of operation.

In some implementations, the memory 124 may include double data rate input/output (DDRIO) circuits that enable the memory 124 to communicate with corresponding DDRIO circuits in the SoC 100 or another device coupled to the memory 124. DDRIO may be configurable for multimode operation. Later generations of LPDDR SDRAM designed to operate at higher operating frequencies may employ lower voltage levels in the core of an SoC or memory device to mitigate for increased power associated with the higher operating frequencies. The amplitude of control, data and/or address signals may be conformed to the voltage levels defined for power supplies in each mode of operation. In one example, LPDDR5 SDRAM, LPDDR5X SDRAM and LPDDR6 SDRAM drive CS signals at different signal levels in different operating modes to wake up SDRAM that is in a power down state to save power consumption when used in battery operated or power limited applications such as mobile communications, mobile computing, low-power sensor systems, automotive and artificial intelligence systems.

Bandwidth available for signaling between a memory controller 114 and a memory 124 may be limited due to the effects of channel loss and other attenuations as well distortions in waveforms caused by unmatched terminations, interference and limitations of DDRIO circuits. Signal quality may vary according to operating conditions that may be characterized as all process, voltage, and temperature (PVT) corners. Certain aspects of this disclosure relate to DDRIO equalization techniques that can offset channel losses and other distortions to enable reliable high-speed operation in systems that employ LPDDR SDRAM. In one example, pre-emphasis equalization may be used by a driver in a DDRIO circuit to overdrive signals at transitions between signaling states, thereby providing an increased data sampling time at the receiver.

Figure 2:
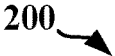
FIG. 2 illustrates certain aspects of a parallel bus interface that may be provided in a memory controller configured in accordance with certain aspects of the present disclosure.
Figure 2:
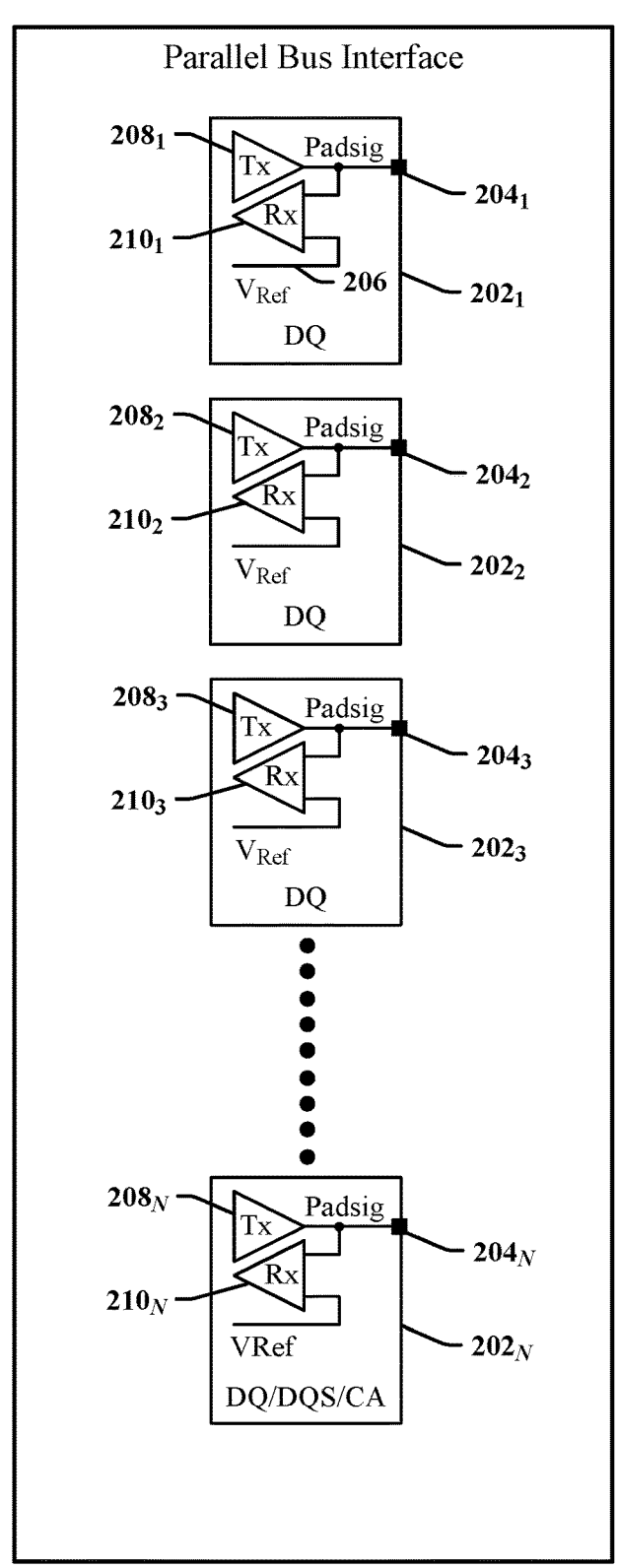

FIG. 2 illustrates certain aspects of a parallel bus interface 200 that may be provided in a memory controller coupled to high-speed LPDDR memory, for example. In some implementations, line drivers in the parallel bus interface 200 are expected to drive a two-rank LPDDR load. As used herein, two or more memory ranks coupled in parallel to a memory controller are accessed simultaneously by asserting a single chip select signal. The parallel bus interface 200 provides DDRIO circuits $202_1$-$202_N$ that are coupled to corresponding terminals of each memory rank. In one example, a terminal may refer to a bonding pad in an IC device to which a connecting wire may be bonded or otherwise contacted. Each of the DDRIO circuits $202_1$-$202_N$ may be configured to transmit and/or receive a data signal (DQ), a differential strobe signal (DQS) or a Command/Address signal (CA). In some implementations, a single memory rank is coupled to the DDRIO circuits $202_1$-$202_N$. Each DDRIO circuits $202_1$-

$202_N$ includes a driver $208_1$-$208_N$ and a receiver $210_1$-$210_N$. The output of each driver $208_1$-$208_N$ and each receiver $210_1$-$210_N$ is coupled to an input/output (I/O) terminal $204_1$-$204_N$ of the parallel bus interface 200. The receivers $210_1$-$210_N$ may compare signaling state of a corresponding I/O terminal $204_1$-$204_N$ to a reference voltage level (e.g., $V_{Ref}$ 206) in order to decode data from the parallel bus that couples the parallel bus interface 200 to memory.

Figure 3:
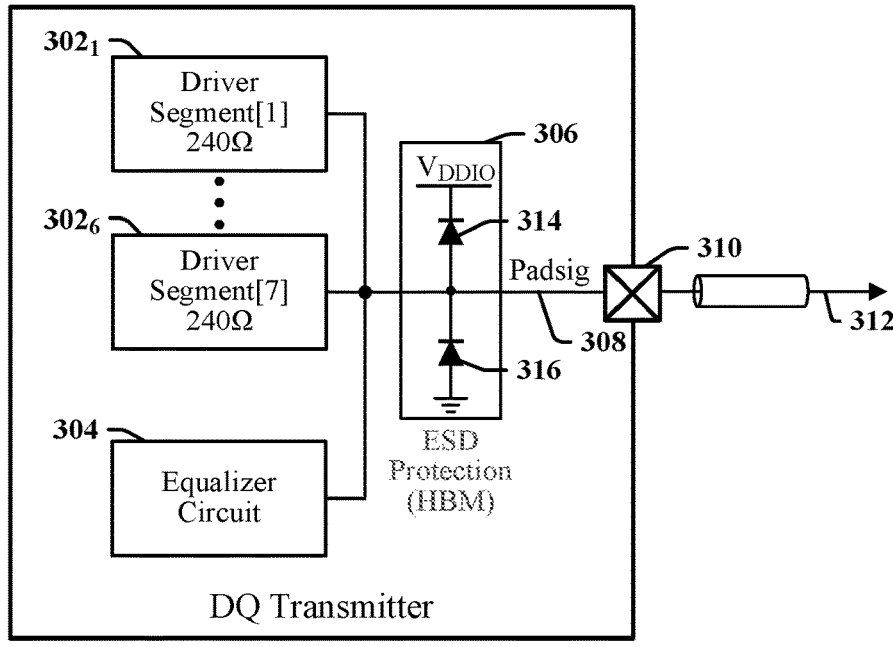
FIG. 3 illustrates certain features of an input/output circuit in a high-speed memory interface.
Figure 3:
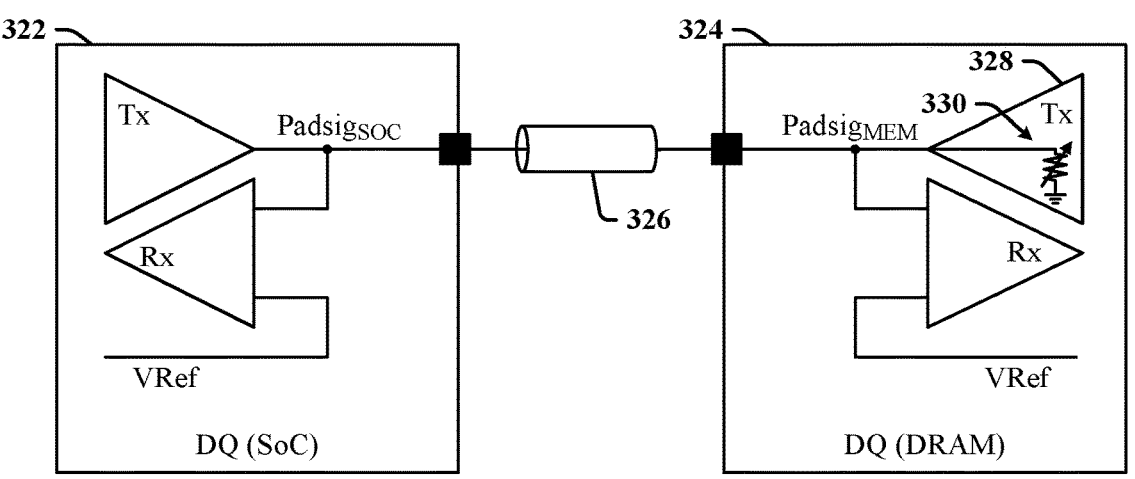

Certain features of a DDRIO circuit 300 are illustrated in FIG. 3. The DDRIO circuit 300 may correspond to one of the DDRIO circuits $202_1$-$202_N$ illustrated in FIG. 2 and may be coupled to an I/O terminal 310 that represents one of the I/O terminals $204_1$-$204_N$ illustrated in FIG. 2. In particular, the illustrated DDRIO circuit 300 corresponds to the configuration of one of the drivers $208_1$-$208_N$ illustrated in FIG. 2. The I/O terminal 310 may be coupled to a line 312 of a high-speed parallel bus that interconnects a memory controller and one or more memory devices. An ESD protection circuit 306, which may be HBM-qualified, may be coupled to the I/O terminal 310. The illustrated ESD protection circuit 306 includes a two diodes 314, 316 that are reverse biased unless a current surge causes a voltage at the I/O terminal 310 to exceed the nominal or rated voltage of the power supply provided to the DDRIO circuit 300. For the purposes of this description, the I/O terminal 310 may correspond to a pad in an IC device or SoC that facilitates bonding or contacting with a connecting wire or other interconnect.

The DDRIO circuit 300 includes multiple driver segments $302_1$-$302_6$ and an equalizer circuit 304. The number of driver segments $302_1$-$302_6$ provided in the DDRIO circuit 300 may be determined by the characteristics of the line 312 that is to be driven and the nature and value of termination at the transmitting and/or or receiving devices. In the example of LPDDR SDRAM, the line 312 may be unterminated when low-power, lower-frequencies are transmitted. Lower frequency signals may be transmitted at higher voltage levels than higher frequency signals. Higher frequency signaling in LPDDR SDRAM applications may use signaling transmitted at near-ground voltage levels and line terminations may be provided.

The number of driver segments $302_1$-$302_6$ used to drive the line 312 may be calculated to provide a desired current or voltage level on the line 312. The number of driver segments $302_1$-$302_6$ used to drive the line 312 may be calculated to provide a desired output impedance of the DDRIO circuit 300. The number and nature of the driver segments $302_1$-$302_6$ used to drive the line 312 may be selected to meet a specified or desired transition time of a signal (Padsig 308) to be transmitted over the line 312 through the I/O terminal 310. Certain LPDDR specifications require that DDRIO circuits support aggressive scaling of the voltage of ($V_{DD4}$) core power rails in order to support higher power optimization. The number and type of driver segments $302_1$-$302_6$ used to drive the line 312 may be dynamically selected based on mode of operation.

The multiple driver segments $302_1$-$302_6$ in the DDRIO circuit 300 may be configured to support different drive strengths and on-die DQ termination (ODT) requirements. In the illustrated example, each driver segment $302_1$-$302_6$ is calibrated to provide a pull-down impedance of 240 ohms. Pull-up may be calibrated to a nominal high output voltage ($V_{OH}$) target, which may be specified with reference to the output power rail voltage ($VDD_{IO}$). $V_{OH}$ represents the minimum required voltage swing for a defined mode of operation. In the example of LPDDR6 memory, $V_{OH}$=0.5*$VDD_{IO}$ for terminated lines and $V_{OH}$=$VDD_{IO}$ for unterminated lines.

The bandwidth of the DDRIO circuit 300 is limited by certain alternating current (AC) characteristics of the active driver segments $302_1$-$302_6$, the equalizer circuit 304, the ESD protection circuit 306 and the line 312 coupled to the I/O terminal 310, which can contribute to the I/O capacitance ($C_{IO}$) measured at the I/O terminal 310. $C_{IO}$ is typically a critical parameter and can limit AC performance at higher frequencies. The equalizer circuit 304 may be configured to offset certain effects of $C_{IO}$ and other parameters that may introduce distortion and non-linear response of the DDRIO circuit 300 and line 312. In some examples, the equalizer circuit 304 may be configured to provide or approximate pre-emphasis in order to mitigate for channel loss and linear inter-symbol interference (ISI). ISI can distort signals when a pulse or an edge transmitted in a time interval (i.e., a unit interval or UI) is affected by a pulse or an edge transmitted in a preceding UI due to non-linear frequency response of the line 312, for example. The equalizer circuit 304 may be provided to enable the DDRIO circuit 300 to operate at, or switch between standards-defined frequencies for LPDDR SDRAM of 6.4 GHz and 4.8 GHz, for example.

FIG. 3 also illustrates an interface 320 that includes a DDRIO circuit 322 in an SoC and a DDRIO circuit 324 in a memory device, where a line 326 of a parallel bus (also referred to as a channel) couples the two DDRIO circuits 322, 324. In the illustrated interface, a termination resistance 330 is provided in the driver 328 of the DDRIO circuit 324 provided in the memory device. The resistance 330 may be implemented as a variable resistor for which resistance can be configured to accommodate changes between low-speed, high-voltage and high-speed, low-voltage modes of operation.

A clock recovery circuit in a receiving device may be configured to provide edges (transitions) in a data recovery clock signal that can be used by a data recovery circuit to sample or otherwise capture serial data from a data signal received over a data communication channel. The edges in the in the data recovery clock signal are timed to fall within the window of stability during which data can be reliably sampled. The data signal or a clock signal received from the transmitter may be distorted during transmission through the data communication channel. Distortion may arise for various reasons including impedance mismatches in the data communication channel, interference and reflected energy. Signal distortion can make it difficult to recover the clock information and the data by the clock recovery circuit and can limit the window of stability during which data can be reliably sampled from the amplified data signal.

Figure 4:
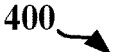
FIG. 4 illustrates an eye diagram generated as an overlay of signaling state for multiple bit transmissions.
Figure 4:
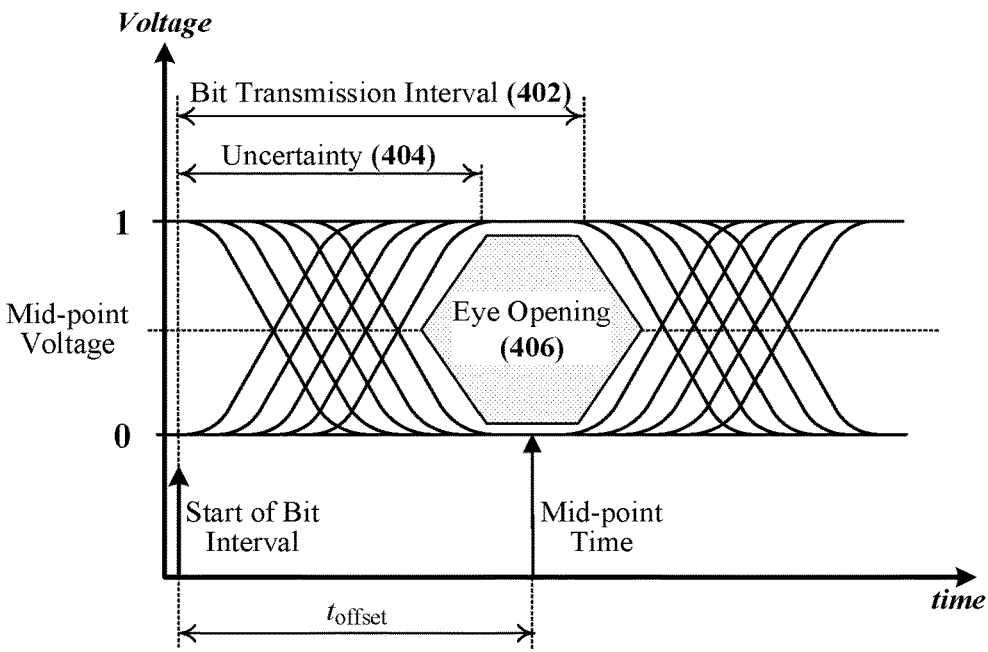
Figure 4:
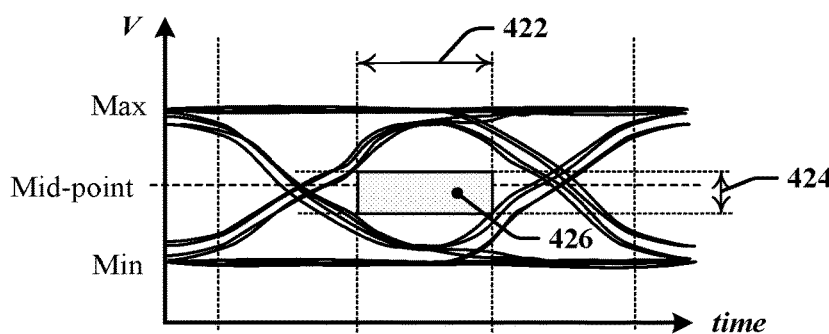

The window of stability during which data can be reliably sampled may be visualized in an eye-diagram. FIG. 4 illustrates one example of an eye diagram 400 generated as an overlay of signaling state for bit transmissions in multiple bit transmission intervals 402, which may also be referred to as UIs. In the illustrated example, a bit transmission can occur in one bit transmission interval 402 that spans a full cycle or half-cycle of a transmitter clock signal. A signal transition region 404 represents a time period of uncertainty at the boundary between two symbols where variable signal rise times prevent reliable decoding. State information may be determined reliably in a region defined by an eye opening 406 that encompasses the window of stability, and that represents the period of period in which signaling state is stable and the bit value can be reliably sampled and captured. The eye opening 406 may be used to define a region in which signal mid-point crossings do not occur. A receiver or decoder can be designed on the assumption that the eye opening 406 represents or delineates a window of stability in which signaling states can be reliably distinguished and in which information can be reliably sampled, demodulated or decoded from a data signal. The window of stability may be determined based on minimum and maximum voltage thresholds. The eye opening 406 may be narrowed along the time axis by increases in data rate and may be compressed in the voltage axis as a result of ISI and other types of interference and distortion. The eye opening 406 may be narrowed along the time axis when rise times or fall times for a data signal differ.

The concept of periodic sampling and overlaid display of the signal is a useful aid for the design, adaptation and configuration of systems that use clock and data recovery circuits. In some examples, clock and data recovery circuits are designed to re-create the received data-timing signal using frequent transitions detected in the received data. The eye opening 406 in an eye diagram 400 observed, simulated or computed as a basis for judging the ability of a clock and data recovery circuit to reliably recover data.

FIG. 4 also provides an example of an eye-diagram 420 that shows the combined effect of distortion and jitter on a data signal received from a high-speed serial data channel. In the illustrated example, a tradeoff between the height 424 and width 422 of the eye opening 426 may be needed to provide an adequate duration of time in which transitions can be reliably detected. Reductions in height 424 of the eye opening 426 may result from moving detection thresholds of the transitions of the received data signal to provide sufficient duration of time in which the data signal can be sampled. The width 422 of the eye opening 426 is determined in part by the variability in phase shift between in-phase and quadrature-phase clock signals. Increasing precision of the phase shift between in-phase and quadrature-phase clock signals can enable operation that produces an eye opening 426 with narrower width 422 and a correspondingly greater height 424.

Certain LPDDR specifications require that DDRIO circuits support aggressive core power rail voltage ($V_{DDA}$) scaling to support higher power optimization and to provide for voltage levels of $V_{DDIO}$ that can vary based on mode of operation. For example, $V_{DDIO}$ may supply power at 0.5 Volts for lower-speed unterminated modes and at either 0.5 Volts or 0.3 Volts for higher-speed, terminated modes. The impedance of driver circuit in the transmitter of an LPDDR device is a function of $V_{DDA}$ and the voltage of a power supply provided to the output driver circuits in an LPDDR bus interface. Demands for power optimization have resulted in dynamic core voltage scaling (DCVS) becoming increasingly aggressive.

The implementation of DCVS in LPDDR bus interfaces necessitates recalibration of driver circuits. In conventional systems, recalibration of driver circuits requires stalling data traffic through LPDDR bus interface circuits until the driver circuits have been recalibrated. Data traffic through the LPDDR bus interface circuits is typically stalled for approximately 3 microseconds (3 μs) or more. The delay associated with recalibration may impact the ability of the LPDDR bus interface to meet latency specifications. Latency may be defined as the expected time elapsed between data becoming available for transmission and the delivery of the data or, in some instances, commencement of transmission of the data. Other measures of latency may be employed.

Conventional systems can take any of a variety of approaches to recalibrating driver circuits when bus frequency is changed, all of which require stalling data traffic through LPDDR bus interface circuits. In some instances, a multibit codeword may be used to control or select the impedance presented by a driver circuit. In various examples, the multibit word may be encoded using binary or unary encoding. Unary encoding, which may be referred to as thermometer encoding, represents data in the quantity of bits set to '1' that precede a terminating '0', or in the quantity of bits set to '0' that precede a terminating '1'. The use of thermometer encoding and other such encoding to accelerate selection of driver circuit impedance can impose a relatively high penalty in the physical area on a semiconductor die needed to implement the driver circuit. The use of thermometer encoding and other such encoding can also significantly increase the complexity of calibration circuits and procedures.

Figure 5:
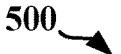
FIG. 5 illustrates certain aspects of a driver circuit that is configurable to operate when power may be supplied at different voltage levels.
Figure 5:
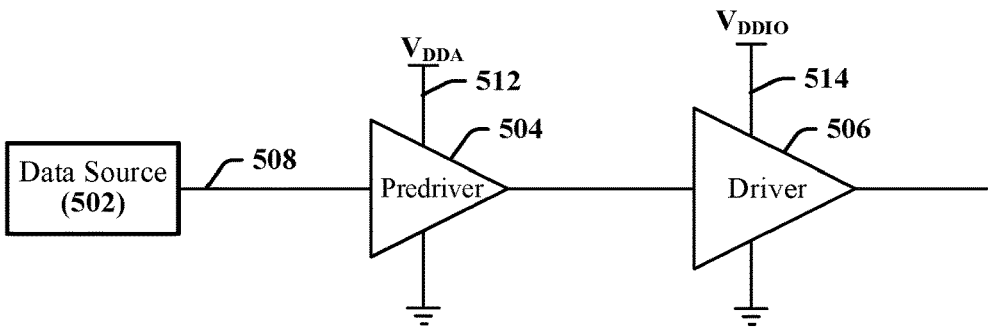
Figure 5:
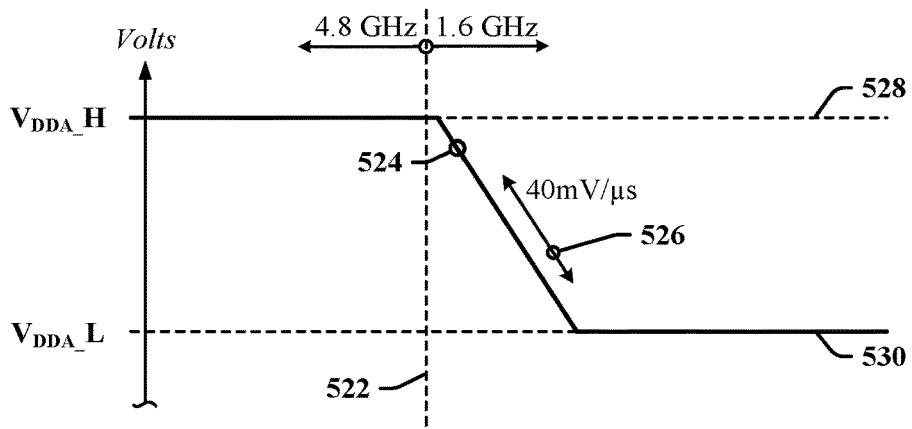

FIG. 5 illustrates certain aspects of a driver circuit 500 that is configurable to operate when power may be supplied at different voltage levels. The driver circuit 500 is implemented in an integrated circuit and is illustrated in a high-level schematic form. The driver circuit 500 includes a predriver 504 and a line driver 506. The predriver 504 receives a data signal 508 from a data source 502 that is typically resident within the core of the integrated circuit. Accordingly, the predriver 504 is coupled to a core power rail 512 and receives power at $V_{DDA}$. The predriver 504 may condition the data signal 508 in order to drive the line driver 506, which operates at the input/output (I/O) voltage level ($V_{DDIO}$). The line driver 506a receives power from an I/O power rail 514 at $V_{DDIO}$. In general, the voltage of $V_{DDA}$ may be expected to be higher than $V_{DDIO}$. In some instances, the voltage of $V_{DDA}$ can be defined or configured within a range that has a lower end that may overlap with a portion of the upper range of voltages that can be defined or configured for $V_{DDIO}$. For the purposes of this disclosure, the core voltage power supply rail in a memory device may be referred to as $V_{DDA}$ and the lowest voltage power supply rail is referred to as $V_{SSX}$.

The graph 520 in FIG. 5 illustrates voltage ramping associated with a change in LPDDR bus interface operating frequency. At a certain point in time 522, bus interface operating frequency switches from 4.8 GHz to 1.6 GHz. A voltage ramp 524 is initiated to reduce $V_{DDA}$ from a first core voltage level 528 ($V_{DDA}$_H) to a second core voltage level 530 ($V_{DDA}$_L). In conventional systems, recalibration of the driver circuit 500 is delayed until the voltage ramp 524 is completed. A variety of undesirable consequences can arise if transmission of data continues before the driver circuit 500 has been recalibrated. In one example, changes in impedance occurring during the voltage ramp 524 can lead to violations of specifications defining $V_{OH}$ (i.e., the specified LPDDR amplitude), eye closure (see the eye diagrams 400, 420 illustrated in FIG. 4) and multiple bit errors. The communication channel coupled to the bus interface may experience increased inter-symbol interference (ISI) due to reflections if calibration is attempted during the voltage ramp 524 due to large step changes in driver output impedance.

Conventional systems typically stall data traffic for approximately 3 μs to allow time for recalibration of the driver circuit 500. Certain LPDDR specifications limit ramp gradient 526 to 40 mV per us and the stall delay may be extended as a result. In one example in which the difference in voltage between the first core voltage level 528 and the second core voltage level 530 is 400 mV, the stall time may need to be extended to approximately 5 µs when the ramp gradient 526 is limited to 40 mV per µs.

Certain aspects of this disclosure can reduce or eliminate data transmission bottlenecks caused data transfers are stalled during changes in LPDDR bus interface operating frequency. Faster transitions between different performance modes can be achieved without compromising data integrity. Physical layer (PHY) circuits in a communication interface can be configured in accordance with certain aspects of this disclosure to implement a dynamic code update scheme that can be performed during, or concurrently with voltage ramping associated with a change in LPDDR bus interface operating frequency.

In certain implementations, a delay-matched control path is configured with a programmable skew that can ensure faster rising edges may be used to recalibrate a driver circuit after a change in LPDDR bus interface operating frequency, including while a voltage ramp affecting the core power supply is in progress. In certain implementations, data traffic stalls can be avoided when a time domain dispersion of code update is used during dynamic driver circuit calibration.

Figure 6:
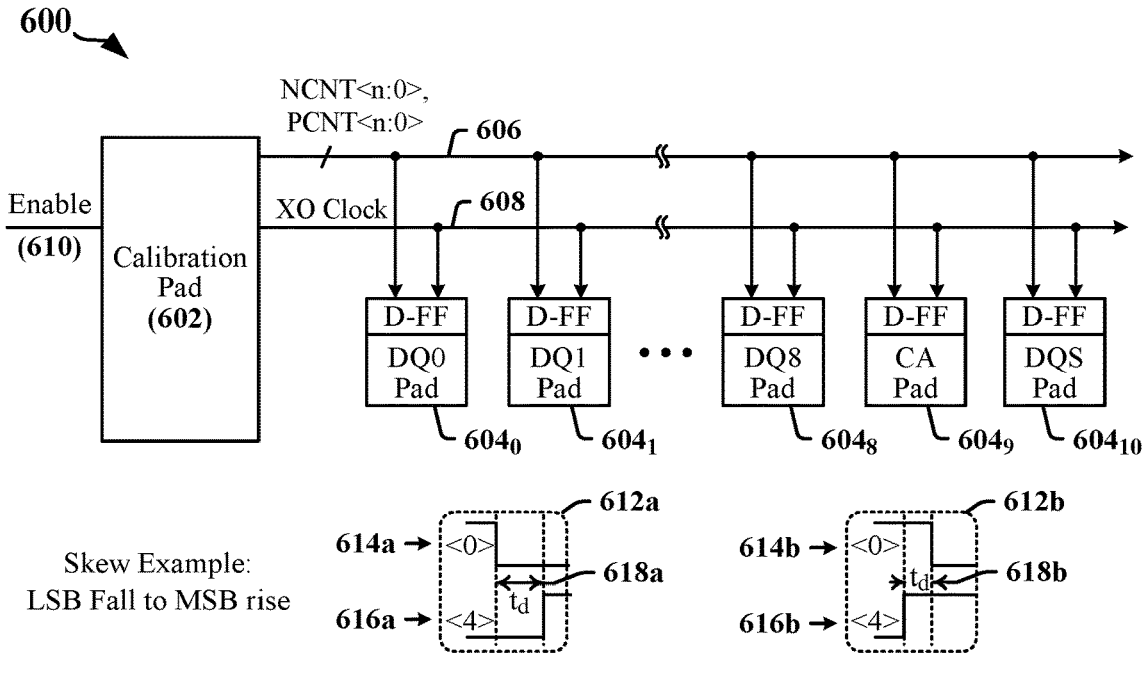
FIG. 6 illustrates certain aspects of a bus interface that is configured in accordance with certain aspects of this disclosure.
Figure 6:
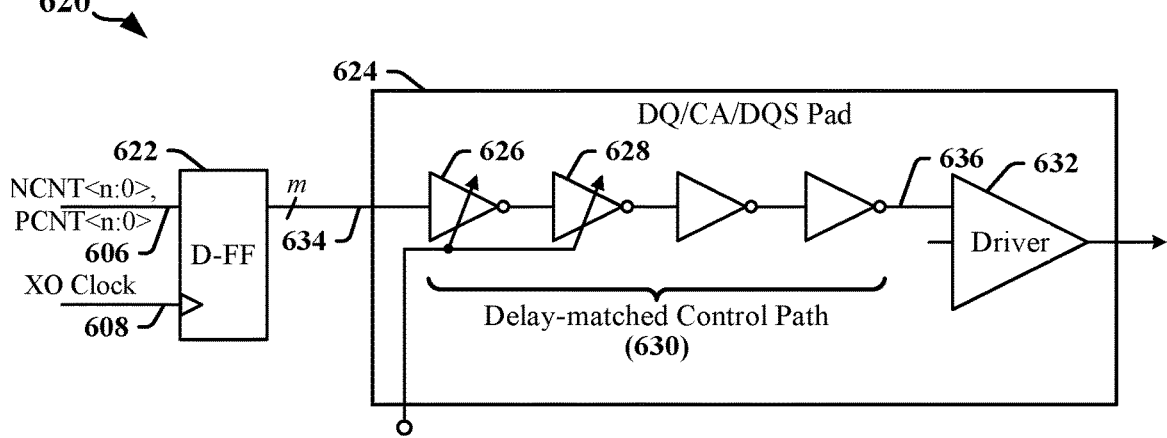
Figure 6:
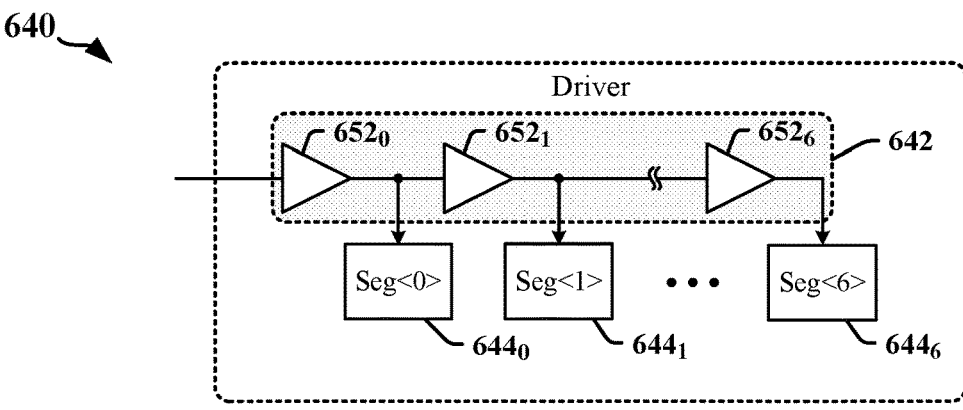

FIG. 6 illustrates certain aspects of a bus interface 600 that is configured in accordance with certain aspects of this disclosure. The bus interface 600 includes a delay-matched control path that may be operated according to certain aspects of this disclosure. A calibration circuit 602, which may be referred to as the calibration pad, generates or provides calibration codes to be used when a voltage ramp occurs. The calibration circuit 602 receives an enable signal 610 and produces code words that are configured to calibrate drivers $604_0$-$604_{10}$ used to transmit data (DQ0-DQ8), address (CA) and data strobe (DQS) signals. In one example, the enable signal 610 is activated during voltage ramping associated with a change in LPDDR bus interface operating frequency.

In the illustrated example, the calibration circuit 602 outputs multibit data streams 606 with a clock signal (the XO clock signal 608) that enables tuning circuits in the drivers $604_0$-$604_{10}$ to capture multibit codewords in the multibit data streams 606 using timing provided by the XO clock signal 608. In the illustrated example, the multibit data streams 606 encode pull-up (PCNT<n: 0>) and pull-down (NCNT<n: 0>) codewords. In certain examples, the pull-up codewords control the gate of one or more pull-up transistors and the pull-down codewords control the gate of one or more pull-down transistors.

Tuning circuits in the drivers $604_0$-$604_{10}$ may include a delay-matched control path configured in accordance with certain aspects of this disclosure. The delay-matched control path may be provided to adjust a skew between certain edges in a multibit codeword. In first example 612a, a falling edge in the least significant bit (the LSB 614a) in a 5-bit codeword precedes a rising edge in the most significant bit (the MSB 616a). In this example 612a, a zero bit-value in the codeword increases the impedance of a driver $604_0$-$604_{10}$, while a non-zero bit-value in the codeword increases the drive strength of the driver $604_0$-$604_{10}$, and both the LSB 614a and the MSB 616a have a zero bit-value for the duration ($t_d$ 618a) of the skew. While ta 618a is typically very brief, the increased impedance of the driver $604_0$-$604_{10}$ can result in eye closure. Increased drive strength of the driver $604_0$-$604_{10}$ can beneficially accelerate transitions between signaling states at the output of the driver $604_0$-$604_{10}$.

The delay-matched control path provided in the driver $604_0$-$604_{10}$ can be used to adjust the skew between edges in the multibit codeword. The second example 612b shows an adjusted skew in which the rising edge in the most significant bit (the MSB 616b) precedes the falling edge in the least significant bit (the LSB 614b). In this example 612b, a zero bit-value in the codeword increases the impedance of a driver $604_0$-$604_{10}$, while a non-zero bit-value in the codeword increases the drive strength of the driver $604_0$-$604_{10}$, and both the LSB 614a and the MSB 616b have a non-zero bit-value for the duration ($t_d$ 618b) of the skew. While $t_d$ 618b is typically very brief, the increased drive strength of the driver $604_0$-$604_{10}$ can result in faster transitions between signaling states.

FIG. 6 illustrates certain aspects of a driver circuit 620 that has been adapted or configured in accordance with certain aspects of this disclosure. The driver circuit 620 may correspond in at least some respects to one or more the drivers $604_0$-$604_{10}$ that are used to transmit data, address and/or data strobe signals. The driver circuit 620 includes a driver pad 624 and a register or multibit D-Flipflop (the D-FF 622) that is configured to capture the pullup and pulldown codewords from the multibit data streams 606 based on timing provided by the XO clock signal 608. The driver pad 624 may provide circuits used by a corresponding driver $604_0$-$604_{10}$ and certain additional tuning control circuits. The multibit output 634 of the D-FF 622 includes a control data stream that is provided to a delay-matched control path 630.

In the illustrated example, the delay-matched control path 630 includes multiple inverters, including at least two configurable inverters 626, 628. Each inverter in the delay-matched control path 630 adds a delay to the control data stream. In the illustrated example, the delay added by the configurable inverters 626, 628 may be adjusted to ensure faster propagation of rising edges relative to propagation of falling edges.

The output 636 of the delay-matched control path 630 is provided to tuning circuits in a line driver 632 or coupled to the line driver 632. FIG. 6 illustrates certain aspects of a line driver circuit 640 that may be used to implement the line driver 632. The line driver circuit 640 may correspond in some respects to the DDRIO circuit 300 illustrated in FIG. 3. For example, the line driver circuit 640 includes multiple driver segments $644_0$-$644_6$ that may be coupled in parallel to a channel, interconnect or wire.

In one aspect of the disclosure, data traffic stalls can be avoided when a time domain dispersion of a code update is used during dynamic driver circuit calibration. The line driver circuit 640 may be configured to implement a code dispersion scheme in accordance with certain aspects of this disclosure. In some implementations of the code dispersion scheme, a delay line 642 is used to disperse the output 636 of the delay-matched control path 630 across the driver segments $644_0$-$644_6$ of the line driver circuit 640. The delay line 642 introduces a time difference between application of updates to different driver segments $644_0$-$644_6$. The time-dispersed updates can ensure that $V_{OH}$ and levels of increases in simultaneous switching output (SSO) noise are constrained and/or limited to specified or desired levels.

Figure 8:
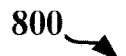
FIG. 8 illustrates certain effects of code dispersion implemented in accordance with certain aspects of this disclosure.
Figure 8:
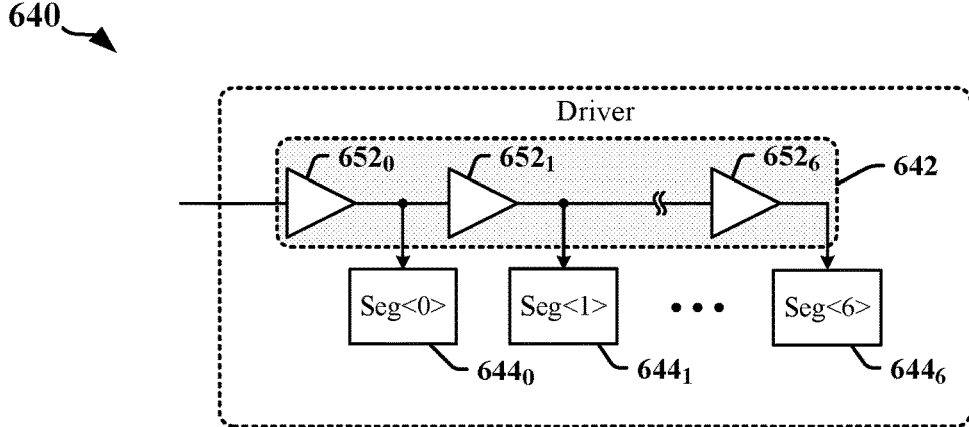

In the illustrated example, the delay line 642 includes serially connected buffer circuits $652_0$-$652_6$. Each of the buffer circuits $652_0$-$652_6$ provides a calibration code to an input of a corresponding driver segment $644_0$-$644_6$. In the illustrated example, each of the buffer circuits $652_0$-$652_6$ is implemented as a non-inverting buffer circuit. In an example illustrated by the table 800 in FIG. 8, code dispersion can be used to incrementally change impedance of the line driver circuit 640 from 40Ω to 33Ω line driver circuit 640 in steps that include a step from 40Ω to 37Ω, a step from 37Ω to 35Ω, a step from 35Ω to 33Ω, a step from 33Ω to 32Ω and a step from 32Ω to 33Ω. An example without code dispersion illustrated by the table 820 in FIG. 8 shows impedance changes that occur in fewer steps, such as a step from 40Ω to 27Ω followed by a step from 27Ω to 33Ω.

Figure 7:
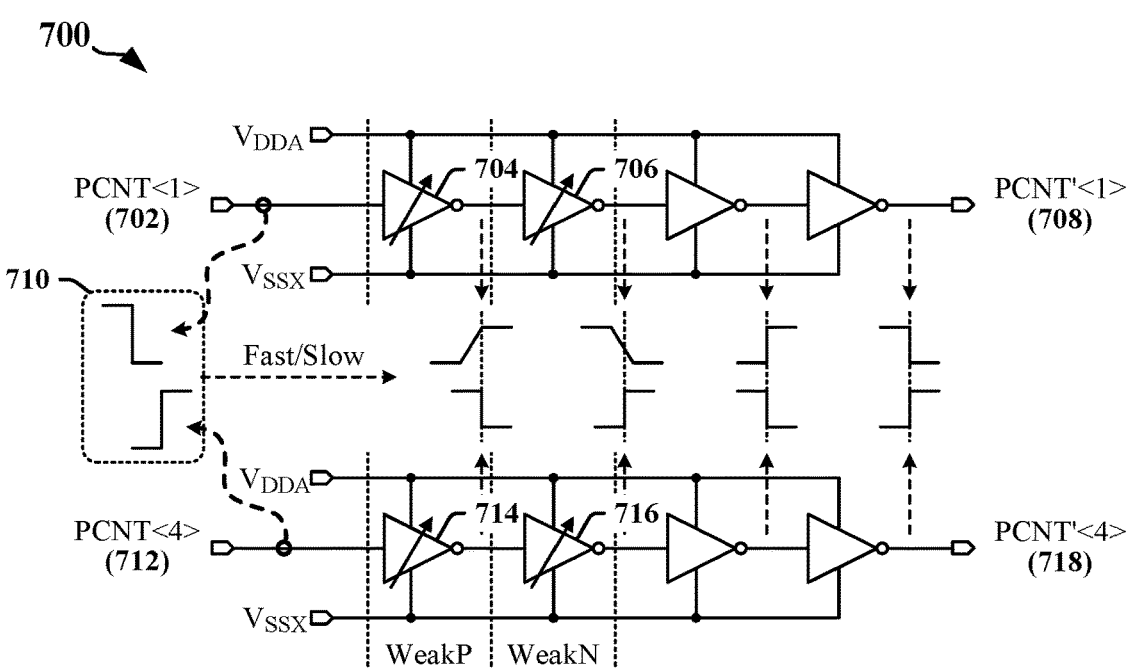
FIG. 7 illustrates certain aspects of the bus interface illustrated in FIG. 6.
Figure 7:
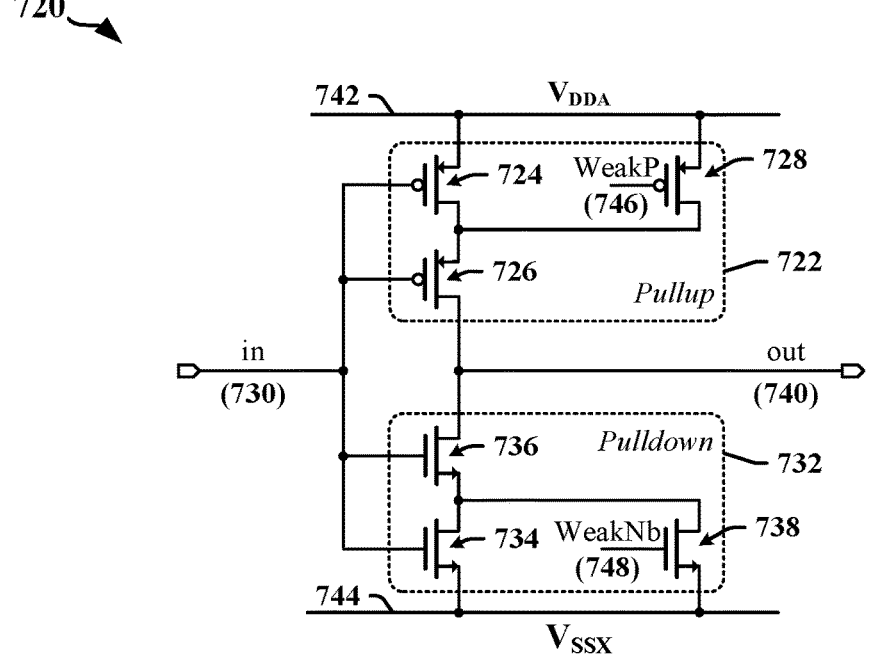

FIG. 7 illustrates certain aspects of the bus interface 600 illustrated in FIG. 6. The operation of a delay-matched control path 630 is illustrated. A driver pad 700, which may correspond to the driver pad 624 illustrated in FIG. 6, includes multiple control paths that deliver one bit of the pull-up codeword or one bit of the pull-down codeword to a tuning circuit in the driver pad. In the illustrated example 700, a first control path receives a first input signal 702 (PCNT<1>) that includes a first transition and a second control path receives a second input signal 712 (PCNT<4>) that includes a second transition. In the depicted signaling scenario 710, the first transition is represented as a falling edge that precedes the second transition, which is represented as a rising edge. This scenario 710 corresponds to the first example 612a of skew illustrated in FIG. 6. The first and second control paths can be configured or calibrated to limit or eliminate the skew in the output signals 708, 718 (PCNT'<1> and PCNT'<4>). In some examples, the first and second control paths are configured to ensure that rising edges in a first output signal 708 precede falling edges in a second output signal 718, and that rising edges in the second output signal 708 precede falling edges in a first output signal 708.

In the illustrated example, each of the input signals 702, 712 is coupled to a corresponding output signal 708, 718 through multiple inverters, including at least two configurable inverters 704 and 706 or 714 and 716. A propagation delay is introduced by each inverter. The delay added by the configurable inverters 704, 706, 714, 716 may be configured, calibrated or adjusted to ensure faster propagation of rising edges in the input signals 702, 712 relative to falling edges in the input signals 702, 712.

In the illustrated example, the configurable inverter 704 that is coupled directly to the first input signal 702 delays the falling edge in the first input signal 702 more than the rising edge in the second input signal 712 is delayed by the configurable inverter 714 that is coupled directly to the second input signal 712.

The configurable inverter 706 delays the rising edge in the output of configurable inverter 704 more than the falling edge in the output of configurable inverter 714 is delayed by the configurable inverter 716. At this stage, the input signals 702, 712 have been inverted and the treatment of rising and falling edges is reversed accordingly. In some implementations, a first intervening inverter (not shown) may be provided between configurable inverters 704 and 706, and a second intervening inverter (not shown) may be provided between configurable inverters 714 and 716. In these latter implementations, the configurable inverters 704, 706, 714, 716 may be configured to produce the same difference in propagation delays between rising and falling edges.

FIG. 7 includes an example of a configurable inverter 720 that may be implemented in accordance with certain aspects of this disclosure. The configurable inverter 720 may be used to implement one or more of the configurable inverters 704, 706, 714, 716.

The configurable inverter 720 may be designed or configured to provide a desired or specified drive strength and/or to assist the driver pad 700 in meeting on-die DQ termination impedance requirements. In the illustrated example, the configurable inverter 720 includes a pullup section 722 and a pulldown section 732.

The illustrated pullup section 722 includes P-type metal-oxide-semiconductor (PMOS) transistors 724, 726, 728. The gates of PMOS transistors 724 and 726, 728 are coupled to an input signal 730 and the drain of PMOS transistor 726 is coupled to an output signal 740. The source of PMOS transistor 726 is coupled to $V_{DDA}$ 742 through the PMOS transistors 724 and 728. The source of PMOS transistor 726 is directly coupled to the drains of PMOS transistors 724 and 728. The gate of PMOS transistor 728 is coupled to a control signal (the WeakP signal 746) that can be used to increase the pullup strength of the configurable inverter 720. In a first signaling state, the WeakP signal 746 causes PMOS transistor 728 to be turned on such that an increased current flows to the output signal 740 through the drain of PMOS transistor 726, when PMOS transistor 726 is turned on. In a first signaling state, the WeakP signal 746 cause PMOS transistor 728 to be turned off such that the current flowing to the output signal 740 through the drain of PMOS transistor 726 when PMOS transistor 726 is turned on is provided only by PMOS transistor 724.

The illustrated pulldown section 732 includes N-type metal-oxide-semiconductor (NMOS) transistors 734, 736, 738. The gates of NMOS transistors 734 and 736, 738 are coupled to the input signal 730 and the drain of NMOS transistor 736 is coupled to the output signal 740. The source of NMOS transistor 736 is coupled to $V_{SSX}$ 744 through the NMOS transistors 734 and 738. The source of NMOS transistor 736 is directly coupled to the drains of NMOS transistors 734 and 738. The gate of NMOS transistor 738 is coupled to a control signal (the WeakNb signal 748) that can be used to increase the pulldown strength of the configurable inverter 720. In a first signaling state, the WeakNb signal 748 cause NMOS transistor 738 to be turned on such that an increased current flows from the output signal 740 through the drain of NMOS transistor 736, when NMOS transistor 736 is turned on. In a first signaling state, the WeakNb signal 748 causes NMOS transistor 738 to be turned off such that the current flowing from the output signal 740 through the drain of NMOS transistor 736 when NMOS transistor 736 is turned on is provided only by NMOS transistor 734.

Figure 9:
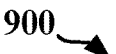
FIG. 9 is a flowchart illustrating an example of a method for reconfiguring a driver circuit in a bus interface according to certain aspects of this disclosure.
Figure 9:
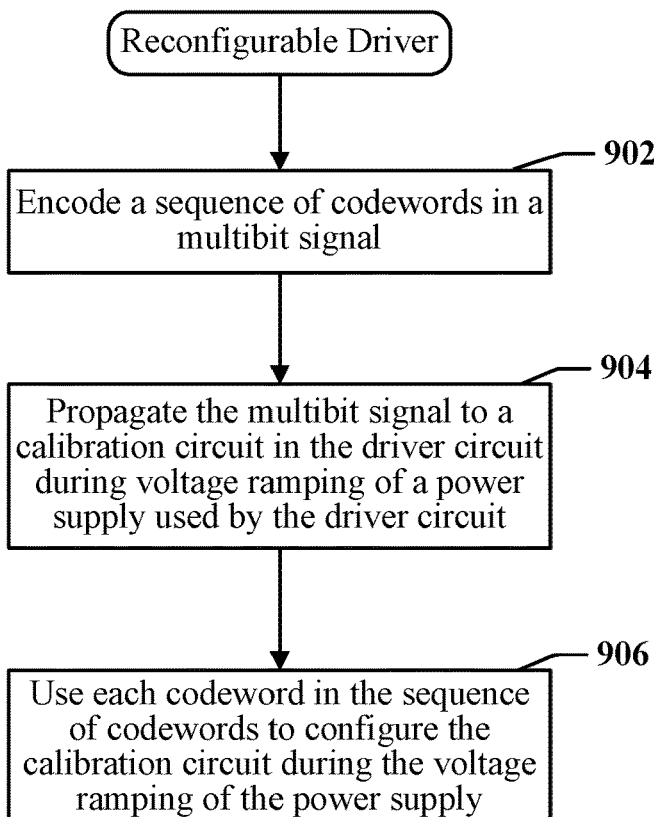

FIG. 9 is a flowchart 900 illustrating an example of a method for reconfiguring a driver circuit in a bus interface in accordance with certain aspects of this disclosure. The method may be implemented, managed or monitored by a controller in the bus interface. The driver may be coupled to data communication link. The driver circuit may be provided in an LPDDR SDRAM interface. In one example, the driver may be included in the bus interface 600 illustrated in FIG. 6.

At block 902, a sequence of codewords may be encoded in a multibit signal. At block 904, the multibit signal may be propagated to a tuning circuit in the driver circuit during voltage ramping of a power supply used by the driver circuit. At block 906, each codeword in the sequence of codewords may be used to configure the tuning circuit during the voltage ramping of the power supply. In certain implementations, the sequence of codewords is configured to incrementally change impedance of the driver during the voltage ramping of the power supply.

In certain implementations, the multibit signal may be propagated to the tuning circuit by providing the multibit signal to a first plurality of series-coupled delay elements. In one example, the first plurality of series-coupled delay elements includes a first configurable delay element that is configured to propagate rising edges more quickly than it propagates falling edges. In another example, the first plurality of series-coupled delay elements includes a first configurable delay element that is configured to propagate falling edges more quickly than it propagates rising edges. The first plurality of series-coupled delay elements may further include a second configurable delay element. In one example, the second configurable delay element is configured to propagate falling edges more quickly than it propagates rising edges. In another example, the second configurable delay element is configured to propagate rising edges more quickly than it propagates falling edges. In some implementations, the first configurable delay element and the second configurable delay element are configured to cause rising edges in the multibit signal to be propagated more quickly through the first plurality of series-coupled delay elements than falling edges in the multibit signal. In some implementations, the first configurable delay element and the second configurable delay element are configured to cause falling edges in the multibit signal to be propagated more quickly through the first plurality of series-coupled delay elements than rising edges in the multibit signal.

In certain examples, each delay element in the first plurality of series-coupled delay elements is implemented using an inverter. In other examples, each delay element in the first plurality of series-coupled delay elements is implemented using a non-inverting buffer circuit.

In certain implementations, an output of the first plurality of series-coupled delay elements may be propagated through a second plurality of series-coupled delay elements. Each delay element in the second plurality of series-coupled delay elements may be configured to propagate the output of the first plurality of series-coupled delay elements to a corresponding segment of the driver circuit. Each delay element in the second plurality of series-coupled delay elements may be implemented using a non-inverting buffer circuit.

The operational steps described in any of the exemplary aspects herein are described to provide examples. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering.

In one example aspects, an apparatus includes means for encoding a sequence of codewords in a multibit signal, and means for propagating the multibit signal to a tuning circuit in a driver circuit during voltage ramping of a power supply used by the driver circuit. Each codeword in the sequence of codewords may be used to configure the tuning circuit during the voltage ramping of the power supply. The means for encoding the codewords may include a flipflop that clocks each codeword through to the means for propagating the multibit signal. The sequence of codewords may be configured to incrementally change impedance of the driver during the voltage ramping of the power supply.

In certain implementations, the means for propagating the multibit signal include a first plurality of series-coupled delay elements. The first plurality of series-coupled delay elements may include a first configurable delay element. In one example, the first configurable delay element is configured to propagate rising edges more quickly than it propagates falling edges. In another example, the first configurable delay element is configured to propagate falling edges more quickly than it propagates rising edges. The first plurality of series-coupled delay elements may further include a second configurable delay element. In one example, the second configurable delay element is configured to propagate rising edges more quickly than it propagates falling edges. In another example, the second configurable delay element is configured to propagate falling edges more quickly than it propagates rising edges. The first configurable delay element and the second configurable delay element may be configured to cause rising edges in the multibit signal to be propagated more quickly through the first plurality of series-coupled delay elements than falling edges in the multibit signal. The first configurable delay element and the second configurable delay element may be configured to cause falling edges in the multibit signal to be propagated more quickly through the first plurality of series-coupled delay elements than rising edges in the multibit signal.

In certain examples, each delay element in the first plurality of series-coupled delay elements is implemented using an inverter. In other examples, each delay element in the first plurality of series-coupled delay elements is implemented using a non-inverting buffer circuit.

In certain implementations, an output of the first plurality of series-coupled delay elements may be propagated through a second plurality of series-coupled delay elements. Each delay element in the second plurality of series-coupled delay elements may be configured to propagate the output of the first plurality of series-coupled delay elements to a corresponding segment of the driver circuit. Each delay element in the second plurality of series-coupled delay elements may be implemented using a non-inverting buffer circuit.

In some implementations, the apparatus is embedded in, or is configured to operate as a driver circuit in an LPDDR SDRAM interface.

A driver circuit configured in accordance with certain aspects of this disclosure may include a flipflop and a first plurality of series-coupled delay elements. The flipflop may be configured to encode a sequence of codewords in a multibit signal. The first plurality of series-coupled delay elements may be configured to propagate the multibit signal to a tuning circuit in the driver circuit during voltage ramping of a power supply used by the driver circuit. Each codeword in the sequence of codewords may be used to configure the tuning circuit during the voltage ramping of the power supply. The sequence of codewords may be configured to incrementally change impedance of the driver during the voltage ramping of the power supply.

In one example, a voltage ramp may necessitate a change of $\Delta R$ ohms in the output impedance of the driver circuit. The sequence of codewords may include N codewords. In this example, each codeword may be configured to cause an incremental change of $\Delta R/N$ ohms. The incremental changes are applied while the voltage of the power supply is ramping. The incremental changes may limit variances in specified or desired output impedance of the driver circuit during ramping. The eye diagram opening associated with signaling through the driver circuit may remain intact when variances in output impedance are limited in this manner.

In certain implementations, the first plurality of series-coupled delay elements includes a first configurable delay element that is configured to propagate rising edges more quickly than it propagates falling edges. In some instances, the first configurable delay element may be configured to propagate falling edges more quickly than it propagates rising edges. These latter instances may arise for different driver circuit configurations, the combination of PMOS and NMOS transistors used and other such reasons. The first plurality of series-coupled delay elements may also include a second configurable delay element configured to propagate falling edges more quickly than it propagates rising edges. The second configurable delay element may be configured to propagate rising edges more quickly than it propagates falling edges when, for example, different driver circuit configurations and/or other combination of PMOS and NMOS transistors are used to implement the driver circuit. The first configurable delay element and the second configurable delay element may be configured to cause rising edges in the multibit signal to be propagated more quickly through the first plurality of series-coupled delay elements than falling edges in the multibit signal. In one example, the relative positions of the first configurable delay element and the second configurable delay element may be selected to determine which type of transition (edge direction) is to be accelerated with respect to the other type of transition.

In some implementations, each delay element in the first plurality of series-coupled delay elements comprises an inverter. In some implementations, each delay element in the first plurality of series-coupled delay elements comprises a non-inverting buffer circuit.

In certain implementations, the driver circuit includes a second plurality of series-coupled delay elements. The second plurality of series-coupled delay elements receives an output of the first plurality of series-coupled delay elements. The second plurality of series-coupled delay elements propagates the output of the first plurality of series-coupled delay elements to a number of segments in the driver circuit. In one example, each delay element in the second plurality of series-coupled delay elements is configured to propagate the output of the first plurality of series-coupled delay elements to a corresponding segment of the driver circuit. In one example, each delay element in the second plurality of series-coupled delay elements comprises a non-inverting buffer circuit. The driver circuit may be provided in an LPDDR SDRAM bus interface.

Some implementation examples are described in the following numbered clauses:

1. A driver circuit comprising: a flipflop configured to encode a sequence of codewords in a multibit signal; and a first plurality of series-coupled delay elements that is configured to propagate the multibit signal to a tuning circuit in the driver circuit during voltage ramping of a power supply used by the driver circuit, wherein each codeword in the sequence of codewords is used to configure the tuning circuit during the voltage ramping of the power supply.

2. The driver circuit as described in clause 1, wherein the sequence of codewords is configured to incrementally change impedance of the driver during the voltage ramping of the power supply.

3. The driver circuit as described in clause 1 or clause 2, wherein the first plurality of series-coupled delay elements comprises a first configurable delay element configured to propagate rising edges more quickly than it propagates falling edges.

4. The driver circuit as described in clause 3, wherein the first plurality of series-coupled delay elements further comprises: a second configurable delay element configured to propagate falling edges more quickly than it propagates rising edges.

5. The driver circuit as described in clause 4, wherein the first configurable delay element and the second configurable delay element are configured to cause rising edges in the multibit signal to be propagated more quickly through the first plurality of series-coupled delay elements than falling edges in the multibit signal.

6. The driver circuit as described in any of clauses 1-5, wherein each delay element in the first plurality of series-coupled delay elements comprises an inverter.

7. The driver circuit as described in any of clauses 1-5, wherein each delay element in the first plurality of series-coupled delay elements comprises a non-inverting buffer circuit.

8. The driver circuit as described in any of clauses 1-7, further comprising: a second plurality of series-coupled delay elements that receives an output of the first plurality of series-coupled delay elements, wherein each delay element in the second plurality of series-coupled delay elements is configured to propagate the output of the first plurality of series-coupled delay elements to a corresponding segment of the driver circuit.

9. The driver circuit as described in clause 8, wherein each delay element in the second plurality of series-coupled delay elements comprises a non-inverting buffer circuit.

10. The driver circuit as described in any of clauses 1-9, wherein the driver circuit is provided in a low-power double data rate synchronous dynamic random access memory (LPDDR SDRAM) interface.

11. An apparatus comprising: means for encoding a sequence of codewords in a multibit signal; and means for propagating the multibit signal to a tuning circuit in a driver circuit during voltage ramping of a power supply used by the driver circuit, wherein each codeword in the sequence of codewords is used to configure the tuning circuit during the voltage ramping of the power supply.

12. The apparatus as described in clause 11, wherein the sequence of codewords is configured to incrementally change impedance of the driver during the voltage ramping of the power supply.

13. The apparatus as described in clause 11 or clause 12, wherein the means for propagating the multibit signal comprises a first plurality of series-coupled delay elements that includes a first configurable delay element configured to propagate rising edges more quickly than it propagates falling edges.

14. The apparatus as described in clause 13, wherein the first plurality of series-coupled delay elements further includes a second configurable delay element configured to propagate falling edges more quickly than it propagates rising edges.

15. The apparatus as described in clause 14, wherein the first configurable delay element and the second configurable delay element are configured to cause rising edges in the multibit signal to be propagated more quickly through the first plurality of series-coupled delay elements than falling edges in the multibit signal.

16. The apparatus as described in any of clauses 13-15, wherein each delay element in the first plurality of series-coupled delay elements comprises an inverter.

17. The apparatus as described in any of clauses 13-15, wherein each delay element in the first plurality of series-coupled delay elements comprises a non-inverting buffer circuit.

18. The apparatus as described in any of clauses 13-17, further comprising: means for propagating an output of the first plurality of series-coupled delay elements to segments of the driver circuit, including a second plurality of series-coupled delay elements, wherein each delay element in the second plurality of series-coupled delay elements is configured to propagate the output of the first plurality of series-coupled delay elements to a corresponding segment of the driver circuit.

19. The apparatus as described in clause 18, wherein each delay element in the second plurality of series-coupled delay elements comprises a non-inverting buffer circuit.

20. The apparatus as described in any of clauses 11-19, wherein the apparatus is provided in a low-power double data rate synchronous dynamic random access memory (LPDDR SDRAM).

21. A method for reconfiguring a driver circuit, comprising: encoding a sequence of codewords in a multibit signal; propagating the multibit signal to a tuning circuit in the driver circuit during voltage ramping of a power supply used by the driver circuit; and using each codeword in the sequence of codewords to configure the tuning circuit during the voltage ramping of the power supply.

22. The method as described in clause 21, wherein the sequence of codewords is configured to incrementally change impedance of the driver during the voltage ramping of the power supply.

23. The method as described in clause 21 or clause 22, wherein propagating the multibit signal comprises: providing the multibit signal to a first plurality of series-coupled delay elements that comprises a first configurable delay element configured to propagate rising edges more quickly than it propagates falling edges.

24. The method as described in clause 23, wherein the first plurality of series-coupled delay elements further comprises a second configurable delay element configured to propagate falling edges more quickly than it propagates rising edges.

25. The method as described in clause 24, wherein the first configurable delay element and the second configurable delay element are configured to cause rising edges in the multibit signal to be propagated more quickly through the first plurality of series-coupled delay elements than falling edges in the multibit signal.

26. The method as described in clause 23, wherein each delay element in the first plurality of series-coupled delay elements comprises an inverter.

27. The method as described in any of clauses 23-26, wherein each delay element in the first plurality of series-coupled delay elements comprises a non-inverting buffer circuit.

28. The method as described in any of clauses 23-26, further comprising: propagating an output of the first plurality of series-coupled delay elements through a second plurality of series-coupled delay elements, wherein each delay element in the second plurality of series-coupled delay elements is configured to propagate the output of the first plurality of series-coupled delay elements to a corresponding segment of the driver circuit.

29. The method as described in clause 28, wherein each delay element in the second plurality of series-coupled delay elements comprises a non-inverting buffer circuit.

30. The method as described in any of clauses 21-29, wherein the driver circuit is provided in a low-power double data rate synchronous dynamic random access memory (LPDDR SDRAM) interface.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The present disclosure is provided to enable any person skilled in the art to make or use aspects of the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A driver circuit comprising:
   a flipflop configured to encode a sequence of codewords in a multibit signal; and
   a first plurality of series-coupled delay elements that is configured to propagate the multibit signal to a tuning circuit in the driver circuit during voltage ramping of a power supply used by the driver circuit,
   wherein each codeword in the sequence of codewords is used to configure the tuning circuit during the voltage ramping of the power supply, and
   wherein the first plurality of series-coupled delay elements comprises a first configurable delay element configured to propagate rising edges more quickly than it propagates falling edges.

2. The driver circuit of claim 1, wherein the sequence of codewords is configured to incrementally change impedance of the driver during the voltage ramping of the power supply.

3. The driver circuit of claim 1, wherein the first plurality of series-coupled delay elements further comprises:
   a second configurable delay element configured to propagate falling edges more quickly than it propagates rising edges.

4. The driver circuit of claim 3, wherein the first configurable delay element and the second configurable delay element are configured to cause rising edges in the multibit signal to be propagated more quickly through the first plurality of series-coupled delay elements than falling edges in the multibit signal.

5. The driver circuit of claim 1, wherein each delay element in the first plurality of series-coupled delay elements comprises an inverter.

6. The driver circuit of claim 1, wherein each delay element in the first plurality of series-coupled delay elements comprises a non-inverting buffer circuit.

7. A driver, comprising:

a flipflop configured to encode a sequence of codewords in a multibit signal;

a first plurality of series-coupled delay elements that is configured to propagate the multibit signal to a tuning circuit in the driver circuit during voltage ramping of a power supply used by the driver circuit, wherein each codeword in the sequence of codewords is used to configure the tuning circuit during the voltage ramping of the power supply; and a second plurality of series-coupled delay elements that receives an output of the first plurality of series-coupled delay elements, wherein each delay element in the second plurality of series-coupled delay elements is configured to propagate the output of the first plurality of series-coupled delay elements to a corresponding segment of the driver circuit.

8. The driver circuit of claim 7, wherein each delay element in the second plurality of series-coupled delay elements comprises a non-inverting buffer circuit.

9. The driver circuit of claim 1, wherein the driver circuit is provided in a low-power double data rate synchronous dynamic random access memory (LPDDR SDRAM) interface.

10. An apparatus comprising:

means for encoding a sequence of codewords in a multibit signal; and means for propagating the multibit signal to a tuning circuit in a driver circuit during voltage ramping of a power supply used by the driver circuit, wherein each codeword in the sequence of codewords is used to configure the tuning circuit during the voltage ramping of the power supply, wherein the means for propagating the multibit signal comprises a first plurality of series-coupled delay elements that includes a first configurable delay element configured to propagate rising edges more quickly than it propagates falling edges.

11. The apparatus of claim 10, wherein the sequence of codewords is configured to incrementally change impedance of the driver during the voltage ramping of the power supply.

12. The apparatus of claim 10, wherein the first plurality of series-coupled delay elements further includes a second configurable delay element configured to propagate falling edges more quickly than it propagates rising edges.

13. The apparatus of claim 10, further comprising:

means for propagating an output of the first plurality of series-coupled delay elements to segments of the driver circuit, including a second plurality of series-coupled delay elements, wherein each delay element in the second plurality of series-coupled delay elements is configured to propagate the output of the first plurality of series-coupled delay elements to a corresponding segment of the driver circuit.

14. The apparatus of claim 13 wherein each delay element in the second plurality of series-coupled delay elements comprises a non-inverting buffer circuit.

15. The apparatus of claim 10, wherein the apparatus is provided in a low-power double data rate synchronous dynamic random access memory (LPDDR SDRAM).

16. A method for reconfiguring a driver circuit, comprising:

encoding a sequence of codewords in a multibit signal;

propagating the multibit signal to a tuning circuit in the driver circuit during voltage ramping of a power supply used by the driver circuit, wherein the propagating the multibit signal comprises providing the multibit signal to a first plurality of series-coupled delay elements that comprises a first configurable delay element configured to propagate rising edges more quickly than it propagates falling edges; and using each codeword in the sequence of codewords to configure the tuning circuit during the voltage ramping of the power supply.

17. The method of claim 16, wherein the sequence of codewords is configured to incrementally change impedance of the driver during the voltage ramping of the power supply.

18. The driver circuit of claim 7, wherein each delay element in the first plurality of series-coupled delay elements comprises an inverter.

19. The driver circuit of claim 7, wherein the driver circuit is provided in a low-power double data rate synchronous dynamic random access memory (LPDDR SDRAM) interface.

* * * * *